United States Patent [19]

Wedel et al.

[11] Patent Number: 4,579,527

[45] Date of Patent: Apr. 1, 1986

[54] INTEGRATED CIRCUIT HANDLER HEATING AND SINGULATION APPARATUS

[75] Inventors: John A. J. Wedel, Mendota Heights; Michael P. Kassner, Brighton, both of Minn.

[73] Assignee: Micro Component Technology, Inc., Shoreview, Minn.

[21] Appl. No.: 688,027

[22] Filed: Dec. 31, 1984

[51] Int. Cl.⁴ .......................... F24J 3/00; F27B 9/06; F27D 11/00

[52] U.S. Cl. .................................. 432/230; 219/388; 432/231

[58] Field of Search ...................... 432/230, 231, 226; 219/388

[56] References Cited

U.S. PATENT DOCUMENTS

| | | | |
|---|---|---|---|
| 2,911,081 | 11/1959 | Dixon | 193/40 |
| 3,028,959 | 4/1962 | Clark et al. | 209/81 |
| 3,216,547 | 11/1965 | DeGood et al. | 193/32 |
| 3,330,401 | 7/1967 | Ahlstedt | 198/26 |
| 3,543,925 | 12/1970 | Loughery, III | 209/74 |
| 3,587,852 | 6/1971 | Kamm et al. | 209/748 |
| 3,588,425 | 6/1971 | Erickson | 219/388 |
| 3,662,881 | 5/1972 | Fineran | 209/73 |
| 3,727,757 | 4/1973 | Boissicat | 209/73 |
| 3,809,860 | 5/1974 | Diepeveen | 219/388 |
| 4,000,798 | 1/1977 | Cedrone | 193/40 |
| 4,058,223 | 11/1977 | Cruse | 214/1 BB |
| 4,234,418 | 11/1980 | Boissicat | 209/542 |
| 4,397,386 | 8/1983 | Kampf | 198/491 |
| 4,504,008 | 3/1985 | Kent et al. | 432/226 |

*Primary Examiner*—John J. Camby
*Attorney, Agent, or Firm*—Lawrence M. Nawrocki

[57] ABSTRACT

The present invention is a device for bringing integrated circuit devices (22), to be tested at a test site, to a temperature to which the devices (22) will be subjected during operating conditions of equipments in which they will ultimately be installed. The device includes a rack (30) comprising a plurality of rails (32) overlying corresponding tracks (24) down which the integrated circuits (22) move through a magazine (20). The rails (32) are adjustable toward and away from their corresponding tracks (24), and both are heated in order to impart thermal energy to integrated circuit devices (22) passing down the tracks (24). Each track (24) has, proximate a lower end thereof, a singulation assembly (56) which not only isolates a single device (22) to be passed to a test site, but also functions to press the lowermost device (22) in a string passing down the respective track (24) into close engagement with the track (24) in order to effect maximum heat transfer.

21 Claims, 11 Drawing Figures

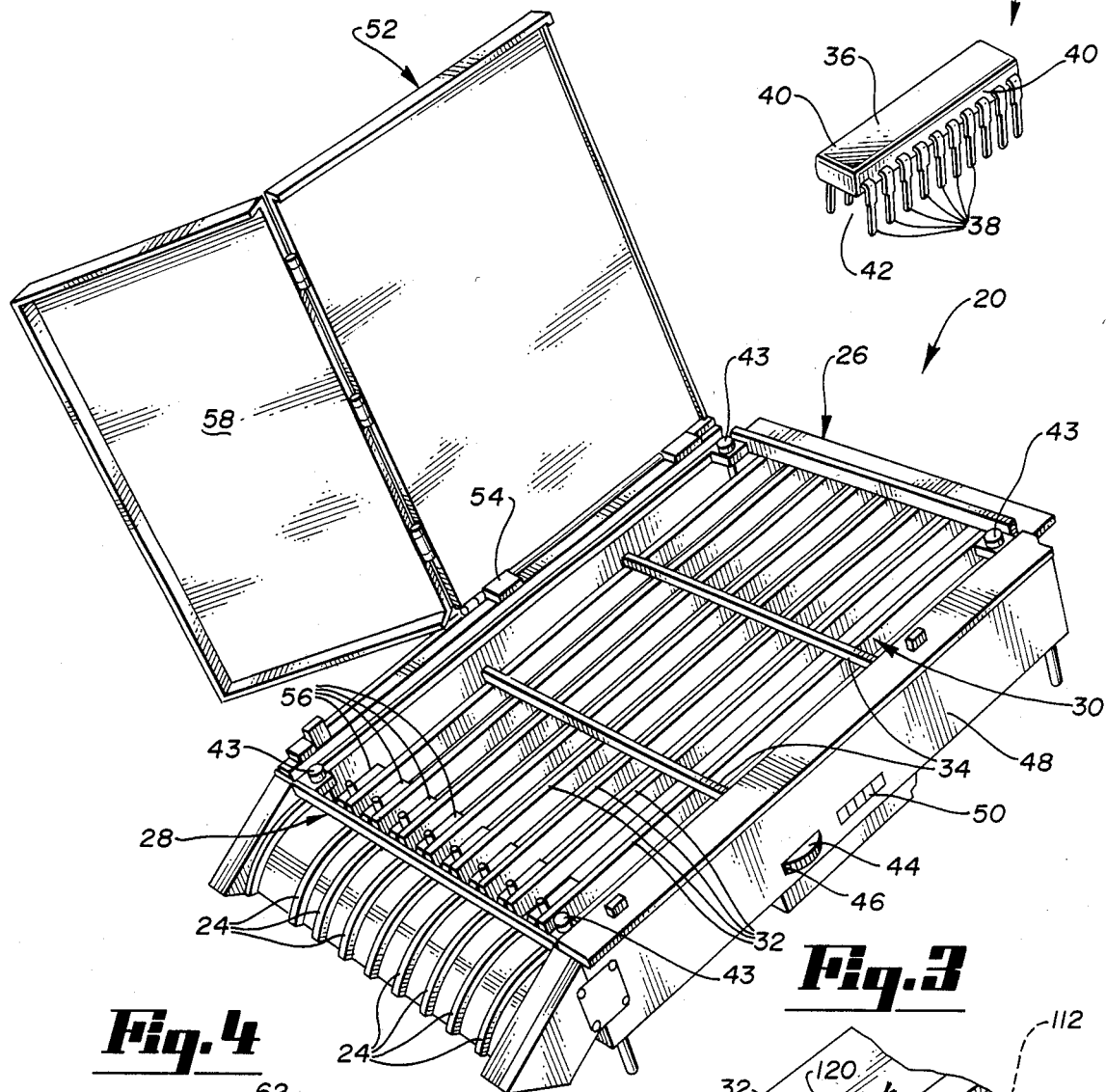
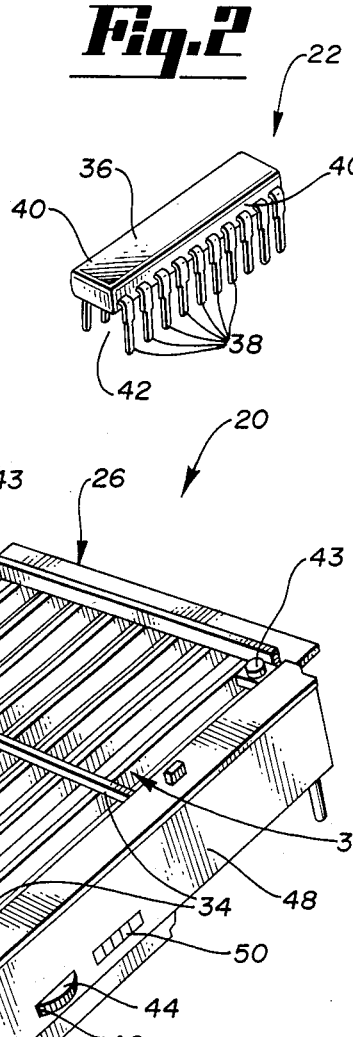
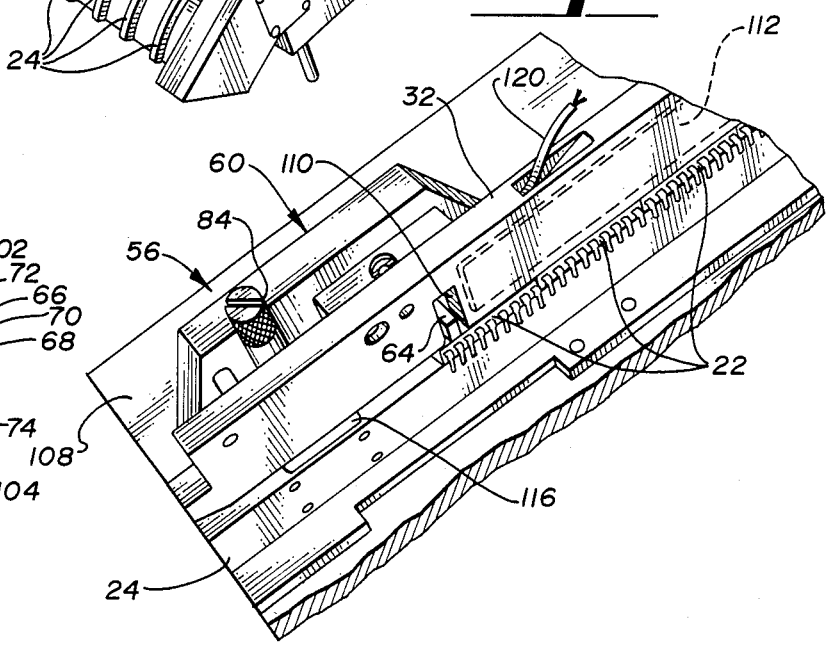
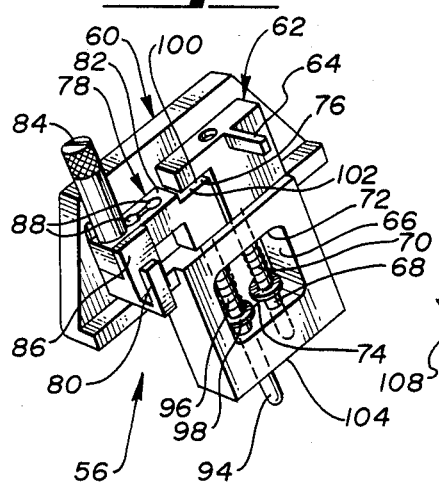

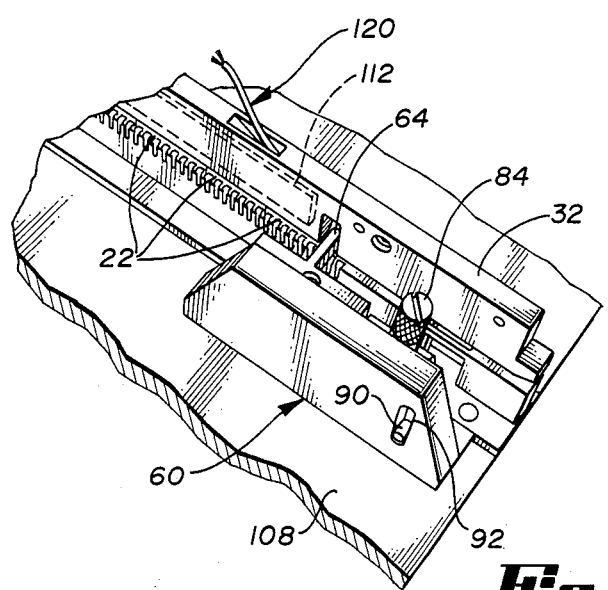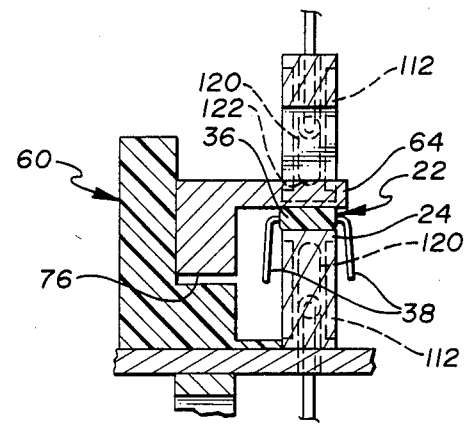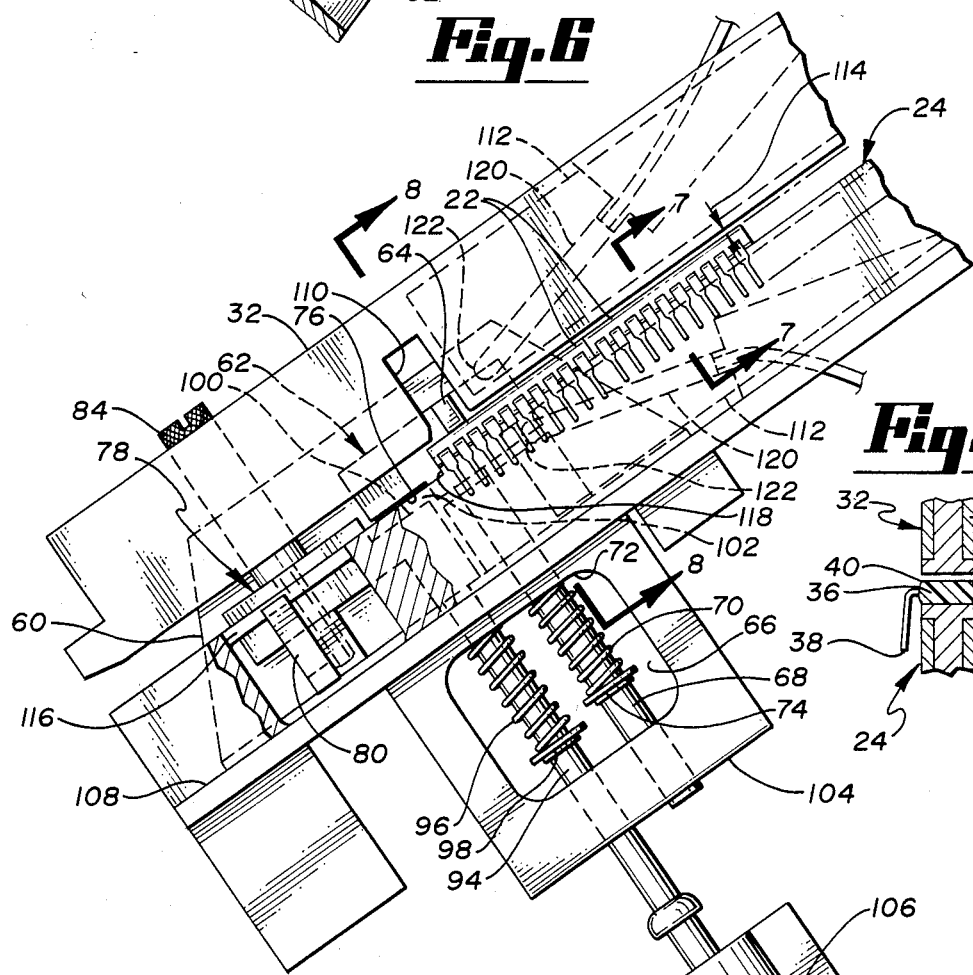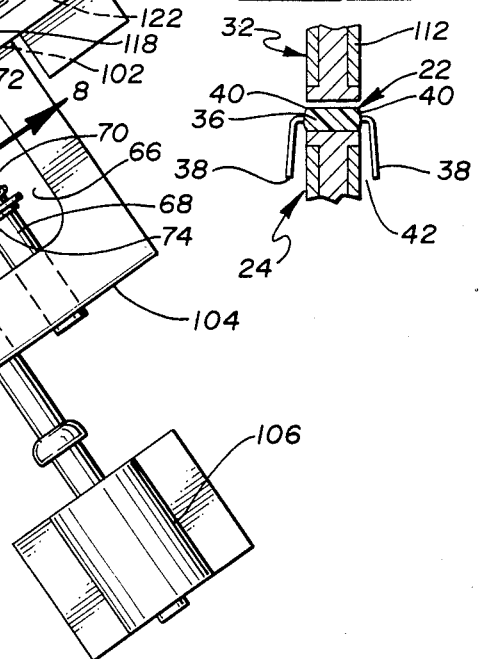

INTEGRATED CIRCUIT HANDLER HEATING AND SINGULATION APPARATUS

TECHNICAL FIELD

The present invention is related broadly to the field of apparatus for feeding integrated circuit devices to a tester for testing the devices and evaluating the functions thereof. More narrowly, the present invention is related to the field of such apparatus for heating the devices to temperature conditions at which they will ultimately operate so that the evaluation performed on the devices will have a maximum level of validity. The invention also, while performing this function, singulates, or isolates, a single device for transmission to a test site of the handler which interfaces with the tester performing the testing.

BACKGROUND OF THE INVENTION

Various types of integrated circuit devices have evolved since the development of the semi-conductor. Typical of such devices are DIPs (dual in-line packages), SOICs (small outline integrated circuits), and PLCCs (plastic leadless chip carriers). Such devices have innumerable applications in industry and commerce.

In many of these applications, it is essential that the devices be accurate to at least a defined minimum percentage of accuracy. While, as to some applications, it is essential that the devices be 100% accurate, in other applications, an accuracy of, for example, 80% might be acceptable if certain critical circuit paths are completely accurate. The manufacturing processes for integrated circuits, as in the case of other manufacturing processes, will produce units of different quality. For this reason, it is necessary to test the units not only to answer the question of whether or not they are operable to any degree, but also to classify the units by degree of operability.

Various high speed testing devices have been developed in order to measure the quality of such devices. Typically, such testers can perform testing upon units at very high rates of speed. It is, therefore, necessary to provide handling equipment capable of feeding units to a test site interfacing with the tester rapidly and, similarly, to convey the units away from the test site at a high rate of speed.

Various high speed handlers have been developed to solve this problem. Methods of singulation (that is, methods of isolating a single device from an input track), have been developed and are constantly undergoing a process of improvement. In order to facilitate ever increasing speed requirements, multiple test site handlers have been designed.

Depending upon the type of device and the application to which it is to be put, the device will be subjected to different environmental operating temperatures. For example, in one application, the device which is being tested will ultimately function in an environment with a temperature significantly higher than ambient room temperature.

A particularly important feature of any handler is that it not only serves to effect the singulation function, but also that it brings integrated circuit devices being handled to the temperatures at which they will ultimately operate. One manner in which the prior art has attempted to accomplish this goal is by providing an input magazine which functions as a temperature chamber, the temperature in the chamber being elevated or lowered by introducing a gas of the desired temperature into the chamber to surround the devices as they pass through the magazine. This tack, although, in some degree, solving the problems, is less than completely adequate. This is so for a number of reasons including the fact that, with such a method, there can be an uneven distribution of the thermal energy in the chamber. As a result, devices at a particular location along a track down which the devices pass will be elevated to a certain temperature, while devices at other locations along the track will be elevated to different temperatures. As can be seen, therefore, problems yet remain.

As previously indicated, it is also important that singulation be effected quickly and efficiently. In order to prevent jamming, any singulation method employed should be simple and responsive to signals transmitted to the structure accomplishing the singulation.

The present invention functions to overcome the problems of the prior art and to satisfy these requirements. It is an improved singulation and heating apparatus for use in high speed integrated circuit device handlers.

SUMMARY OF THE INVENTION

The present invention provides a structure for raising or lowering the temperature of the devices to be tested to their ultimate operational temperatures and for quickly, efficiently, and accurately singulating devices for test. It includes a track down which devices to be tested pass in moving to the test site at which testing occurs. The track is heated and, as nearly as possible, maintained at the temperature to which the devices will be subjected during ultimate operating conditions. The invention includes means, proximate a discharge end of the track from which the devices exit to the test site, for pressing the devices into tight engagement with the track in order to maximize thermal energy transfer from the track to the device. Since this operation occurs just before the device goes to the test site, it will enter the test site maintained at a temperature close to the desired temperature. In order to further enhance temperature approximation, a rail, maintained at the desired temperature, is posited spaced from the track slightly thereabove so that, as integrated circuit devices to be tested pass down the track, thermal energy transfer will also occur between the rail and the devices.

In order to render a structure built in accordance with the invention as universal as possible, the rail can be adjustable relative to the track so that integrated circuit devices of differing thicknesses can be accommodated. The rail can be adjusted so that, regardless of the thickness of the main body portion of the device to be tested, a small gap will be provided between the rail and an upper surface of the main body portion of the device.

In one embodiment of the invention, multiple tracks and corresponding multiple rails can be provided. In this embodiment, the tracks can be similarly dimensioned and disposed in a parallel fashion relative to one another to define a generally rectangular matrix. The upper surfaces of the tracks along which the devices ride, can be arranged relative to one another in order to define a common plane. When such a structure is employed, the multiple rails can be integrated into a unitary assembly disposed above this common plane. The rack can be maintained for adjustment above this common plane by means of a plurality of corner posts, one positioned at each corner of the rectangular matrix, for regulating the spacing between the rack and the common plane defined by the tracks. By providing such a structure, when it is desirable or necessary to change the type of integrated circuit device being tested and the different device has a main body portion of a different thickness, the spacing of all rails with respect to their corresponding tracks can be changed by means of a single adjustment.

In the preferred embodiment, a bottom device of a string of devices along any particular track can be pressed tightly into engagement with the track in order to maximize heat transfer therebetween by means of a stop disposed at a defined lowermost station. The stop can be biased toward the track so that, unless the bias is overcome, it will impinge upon a device at the station to effect the tight engagement sought.

Singulation can be accomplished with such a device by providing a second stop, reciprocable through an aperture formed in the track at a location below the first stop. The second stop is spaced from the first stop a distance along the track greater than the dimension of a device measured along an axis along which the devices pass down the track. Normally, the second stop is withdrawn onto the side of the track opposite the side down which the devices pass so that it does not obstruct movement.

Means are provided for actuating the second stop, when singulation is desired, to move through the aperture into a position obstructing movement down the track. Such actuation can be responsive to the sensing that a device in the lowermost station has achieved the desired temperature.

As a result of actuation of the second stop, the bias of the first stop will be overcome, and it will be withdrawn in order to allow the device in the lowermost station to pass down the track and into engagement with the second stop. Once the device has obtained that position, the second stop will reciprocate back through the aperature in order to allow the device it was obstructing to pass to the test site. As the second stop is withdrawn, the first stop will, again, return, as a result of its biasing, to a position impinging upon the next integrated circuit device in the string. That device will, of course, be in a position at which the first stop can impinge thereupon because the spacing between the first and second stops along the track will be such that, when a device moves from the lowermost position down the track and into engagement with the second stop, its length will limit the downward movement of the next upwardly positioned integrated circuit device in the string, wherein it can be impinged upon by the first stop.

As will be seen, when providing such a method of singulation and maximization of heat transfer, it is desirable to be able to adjust the spacing between the first and second stops in order to accommodate integrated circuit devices of different lengths. The present invention provides means for so doing.

The present invention is, thus, an improved structure for overcoming problems of the prior art and for efficiently accomplishing the intended goals of singulation and maximization of heat transfer. More specific features of the device and advantages obtained in view of those features will become apparent with reference to the DETAILED DESCRIPTION OF THE INVENTION portion of this document, the appended claims, and the accompanying drawings.

BRIEF DESCRIPTION OF THE DRAWINGS

FIG. 1 is a perspective view of a plurality of singulators in accordance with the present invention mounted in a housing incorporating a corresponding number of heated rails integrated into a unitary rack assembly;

FIG. 2 is a pictorial view of a DIP (dual in-line package) as known in the prior art;

FIG. 3 is a partial perspective detail view showing the singulator assembly;

FIG. 4 is a perspective view of the singulation assembly;

FIG. 5 is a view, similar to FIG. 3, but from another perspective;

FIG. 6 is a side elevational view of the discharge end of a track with some portions broken away;

FIG. 7 is a detailed sectional view of a DIP (dual in-line package) and heated rail assembly taken generally along the line 7—7 of FIG. 6;

FIG. 8 is a sectional view taken generally along the line 8—8 of FIG. 6;

DETAILED DESCRIPTION OF THE INVENTION

Figure 9:
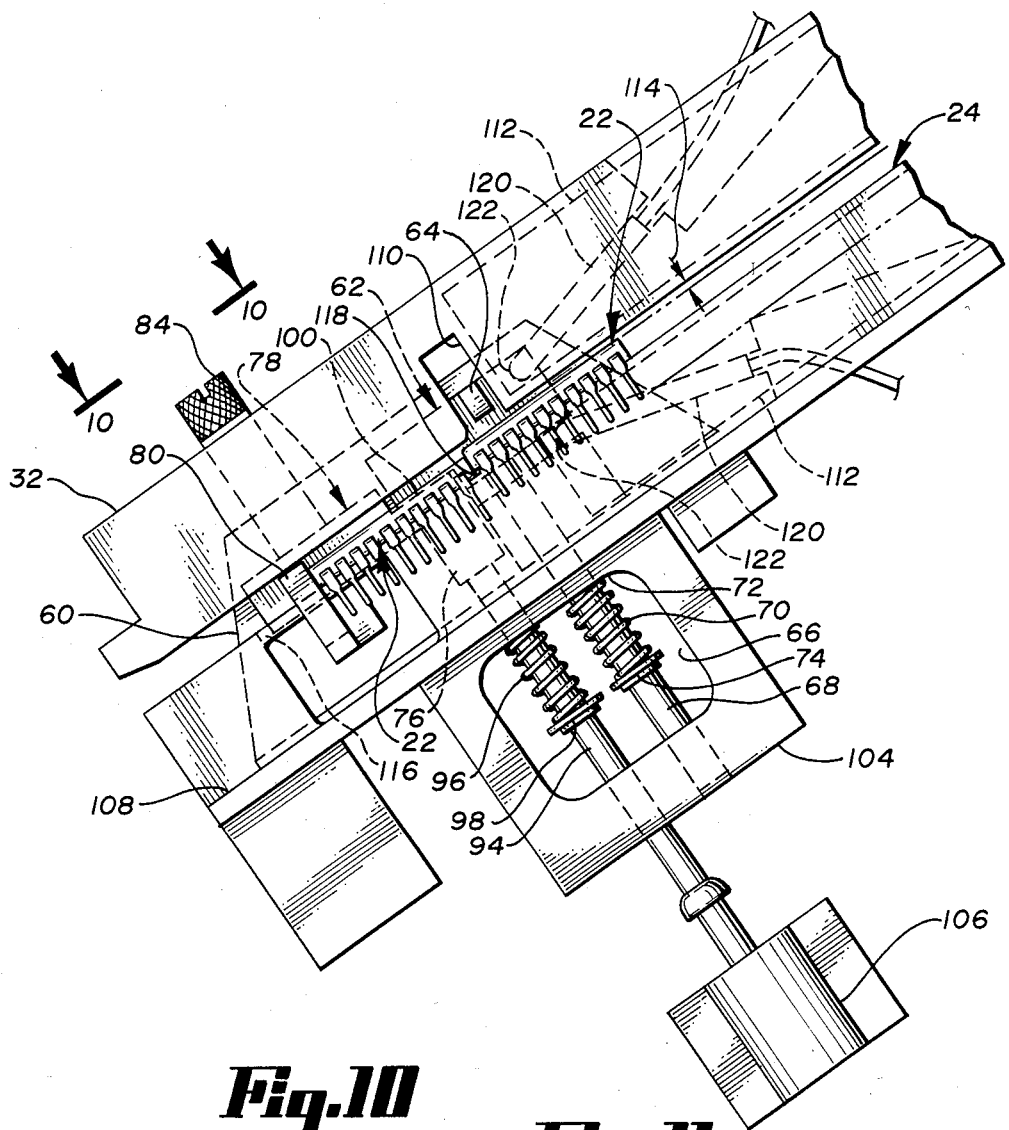
FIG. 9 is a side elevational view, similar to FIG. 6, illustrating a DIP having passed the first stop and being obstructed by the second stop.
Figure 10:
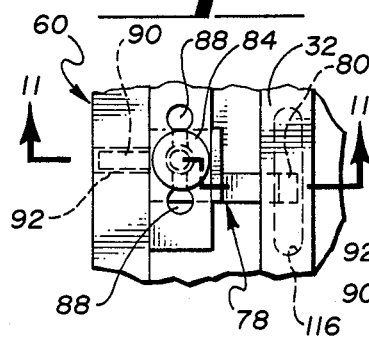
FIG. 10 is a top plan view of the singulator assembly taken generally along the line of 10—10 of FIG. 9.
Figure 11:
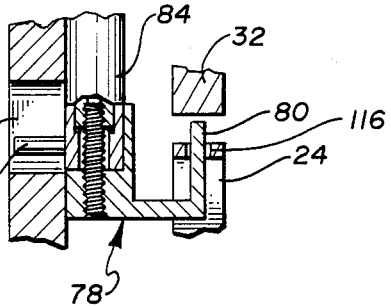
FIG. 11 is a sectional view taken generally along the line 11—11 of FIG. 10.

Referring now to the figures wherein like reference numerals denote like elements throughout the several views, FIG. 1 illustrates an input magazine 20 for feeding integrated circuit devices 22, such as the DIP shown in FIG. 2, to a test site (not shown) interfacing with a tester (also not shown). The magazine 20 includes a housing enclosing a plurality of tracks 24 sloping downwardly from an input end 26 of the magazine 20 to an output or discharge end 28. The tracks 24 are best seen in FIG. 1 curling downwardly after leaving the magazine 20. Integrated circuit devices 22 such as the DIP illustrated in FIG. 2, after leaving the magazine 20, continue to the test site for testing. Although eight tracks 24 are illustrated as being laterally spaced from one another, it will be understood that any number of tracks could be employed, and, in certain embodiments, the tracks could be stacked vertically if such an arrangement were deemed appropriate.

FIG. 1 illustrates a rack 30 integrating eight rails 32 for disposition above the eight tracks 24, each of said rails 32 being adjustably spaced above a corresponding track 24. The rails 32 can be integrated into the common rack 30 by appropriate means such as cross bars 34.

Although the present invention can be utilized with integrated circuit devices 22 of various types, discussion hereinafter will focus upon DIP devices for illustration purposes. Such devices include a main body portion 36 and a plurality of contacts 38 extending from the main body portion 36. The main body portion 36 is formed of any appropriate material such as silicon. As shown in FIG. 2, the electrically conductive contacts 38 extend from lateral edges 40 to form a channel 42 therebetween. When the present invention is used with DIPs, the devices ride on the tracks 24 with the two rows of contacts 38 straddling the particular track 24.

Since different types of DIPs 22 have different thicknesses of the main body portions 36, the rack 30 comprising the upper rails 32 is adjustable in a direction generally perpendicular to a plane defined by the upper surfaces of the tracks 24. When it is necessary to test DIPs 22 having a greater main body portion thickness, the rack 30 will be adjusted away from the tracks 24 in order to accommodate those integrated circuit devices 22.

The present invention incorporates means for adjusting the spacing between the rack 30 and the tracks 24. The rack 30 is mounted proximate four corners thereof to the housing by means of corner posts 43. A thumb wheel 44 protrudes through a slit 46 formed in one lateral wall 48 of the housing, and means (not shown) are provided for transmitting rotation of the thumb wheel 44 to the four corner posts 43 at which the rack 30 is mounted and translating that rotational motion of the thumb wheel 44 into simultaneous movement of the corner posts 43 in a particular direction depending upon the direction of rotation of the thumb wheel 44. If desired, means can be provided for ascertaining the distance between the rails 32 and their corresponding tracks 24, and a digital representation 50 of the reading ascertained can be displayed in a convenient location.

The housing can be provided with a cover 52 hinged to a lateral edge 54 of the housing along a line running generally parallel to the tracks 24 down which the integrated circuit devices 22 pass. By opening this cover 52, access can be had to substantially the full lengths of the tracks 24 and rack rails 32.

In certain circumstances, however, it might be desirable to obtain access only to the lower ends or discharge ends of the tracks 24 at which singulation assemblies are mounted. For example, as will be seen later, the housing functions to retain heat generated therewithin in order to bring the temperature of the devices 22 to be tested up to a temperature at which they will ultimately operate in certain equipments. If a jam occurs proximate singulation assemblies 56, it might be undesireable to open the full cover 52 and allow large amounts of thermal energy to escape. For this reason, the lower portion of the cover 52 can be hinged along a line generally perpendicular to the tracks 24 and rack rails 32 bifurcating the cover 52 to define a lower hinged portion 58 which, when pivoted upwardly, can afford access only to the area proximate the singulation assemblies 56.

FIG. 4 illustrates a single singulation assembly 56 which can be used in combination with one of the tracks 24 mounted in the housing. The assembly 56 includes a mount 60 by which various operational components of the assembly 56 are affixed in positions relative to the track 24 in order to effect singulation. The mounting block 60 can be made of nylon or other appropriate material.

The assembly 56 includes a first stop 62 having a projection 64 which, when the mounting block 60 is affixed in position relative to a track 24, is able to impinge upon a device 22 to be tested at a defined lowermost station along the track 24. This impingement is best seen in FIGS. 3 and 6.

Means are provided to bias the stop 62 and, in turn, the projection 64 toward the track 24 in order to effect this impingement. As seen in FIG. 4, the mounting block 60 can include a cavity 66 into which a shaft 68 extending downwardly from the stop 62 projects. The shaft 68 can carry a spring 70 engageable against a shoulder carried by the shaft 68 and a wall 72 of the cavity 66 to urge the shaft 68 and, in turn, the stop 62 downwardly. The shoulder carried by the shaft 68 can be a C-ring 74 fitted into an annular groove formed in the shaft 68, or other appropriate structure.

The first stop 62, further, carries an abutment 76 which faces downwardly. The abutment 76 serves a function discussed hereinafter.

The mounting block 60 also carries a second stop 78. The second stop 78 includes a tab 80 which is adjustable axially with respect to the axis of elongation of the track 24 down which the devices 22 to be tested pass. Adjustability of the tab 80 enables the singulation assembly 56 to be reconfigured so that singulation can be effected regardless of the dimension of the main body portion 36 of the DIP 22 along the axis of elongation of the track 24. Discussion later in this document will further amplify upon this adjustability feature.

FIG. 4 shows a second stop tab 80 which is positionable in one of three locations with respect to the main portion 82 of the stop 78. Adjustment of the tab 80 illustrated in FIG. 4 is accomplished by threadably loosening a knurled knob 84 holding the tab 80 in position relative to the main portion 82 of the stop 78, repositioning the tab 80 axially relative to the axis of elongation of the track 24 until a hole in the tab portion 86 for receiving the knurled knob 84 is aligned with an alternative aperture 88 in the second stop main portion 82, and rethreading the knob 84 into the hole in the tab portion 86 to secure the tab 80 at that alternative location.

The second stop 78 is disposed for reciprocation along a path parallel to that along which the first stop 62 is biased, and the stop 78 carries an ear 90 which runs in a slit 92 to govern this movement. The second stop 78 also includes a downwardly extending shaft 94 having at least a portion accessible in the cavity 66 in which the shaft 68 of the first stop 62 is accessible. As in the case of the first stop 62 also, the second stop 78 is biased downwardly by means of a spring 96 engaging the wall 72 of the cavity 66 and appropriate means such as a C-ring 98 received in a groove of the shaft 94.

The second stop 78 carries a shoulder 100 which is opposite the abutment 76 of the first stop 62. Typically, there is a small gap 102 between the first stop abutment 76 and the second stop shoulder 100.

The shaft 94 extending from the second stop 78, as seen in FIG. 4, extends through a bottom surface 104 of the mounting block 60 where it is accessible for mating to an actuation solenoid 106. The solenoid 106, while not seen in FIG. 4, is illustrated in FIGS. 6 and 9.

FIGS. 3 and 5 illustrate the singulation assembly 56 as mounted to a platen 108 within the housing in a location relative to the track 24 and rail 32 with respect to which it operates. Referring first to FIG. 3, the upper rail 32 is illustrated as having a recess 110, extending generally perpendicular to the direction of movement of the integrated circuit devices 22 down the track 24, which accommodates the projection 64 carried by the first stop 62 and its movement therealong. The lowermost station of the track 24 is defined as being proximate this recess 110. Because of the biasing of the projection 64 of the first stop 62 toward the track 24 at this location, when a string of devices 22 is mounted to the track 24 to pass down the track 24, the projection 64 can impinge upon the lowermost of the devices 22 at this station and hold it in tight engagement with the track upper surface.

Both the track 24 and upper rail 32 can carry heating elements 112 in order to impart to the devices 22 to be tested a temperature approximating that to which they will be subjected in an instrument in which they will ultimately be installed. These heating elements 112 are illustrated in phantom in FIGS. 6 and 9.

As seen in FIGS. 6 and 9, the adjustable rail 32 will be positioned closely proximate the upper surface of the DIPs 22 in order to facilitate maximum energy transfer. There must, necessarily, be at least a small spacing, as at 114, however, in order to allow the DIPs 22 to pass down the track 24. As a result, although they will ride down the upper surface of the track 24, they can come out of tight engagement with the track 24, and maximum heat transfer will not be effected.

When the bottom DIP 22 in the string is in the lowermost station, however, impingment of the projection 64 carried by the first stop 62 will function to tightly press that device into contact with the track 24. Consequently, maximum heat transfer will be effected when the device 22 is in this lowermost station.

The tab 80 carried by the second stop 78 is positioned relative to the track 24 to be reciprocable through an aperture 116 formed in the upper surface of the track 24 at a location below the lowermost station. The normal position of the tab 80 is such that it is disposed not to protrude upwardly through the aperture 116. When the solenoid 106 is actuated, however, and, in turn, urges the shaft 94 carried by the second stop 78 in a direction to overcome the spring bias 96, the tab 80 will pass through the aperture 116 and upwardly so as to obstruct movement of devices 22 to be tested downwardly along the track 24. The gap 102 between the abutment 76 of the first stop 62 and the shoulder 100 of the second stop 78 is such that the tab 80 will extend above the upper surface of the track 24 prior to the abutment 76 being engaged by the shoulder 100.

Once engagement is effected, however, the first stop 62 will be lifted by the second stop 78, and the bottom integrated circuit device 22 in the string will be released to pass downwardly. Since the tab 80 has already risen above the upper surface of the track 24, downward movement of the string of devices 22 beyond the second stop tab 80 will be precluded.

In the preferred embodiment, axial adjustment of the tab 80, as previously discussed, will be made so that, when the bottom device 22 in the string engages the tab 80, the next upwardly device 22 will be in the lowermost station along the track 24 and, therefore, capable of being impinged upon by the first stop projection 64. With the string of devices 22 in this position, the solenoid 106 can be actuated to withdraw and allow the spring bias 96 to urge the second stop 78 to its normal position wherein the tab 80 does not occlude movement of the devices 22 down the track 24. Because of the relationship of the first stop projection 64 and the second stop tab 80 in a direction perpendicular to the direction in which the devices 22 pass down the track 24, the projection 64 will engage the device 22 in the lowermost station before the device 22 engaging the second stop tab 80 is released.

The upper surface of the track 24 can be provided with a step 118 down which the bottom integrated circuit device 22 in the string passes once released by the first stop 62. By passing down this step 118, the bottom device 22 in the string can be axially misaligned from the other devices in the string to accomplish an isolation thereof.

As best seen in FIGS. 3, 6, and 9, the aperture 116 provided in the upper surface of the track 24 in order to accommodate the reciprocation of the second stop tab 80 can be elongated along the axis of the track 24. By so elongating the aperture 116, axial adjustment of the tab 80 is permitted.

As previosuly indicated, the tracks 24 and upper rails 32 are heated by appropriate heater elements 112. These elements 112 are best illustrated in FIGS. 6 and 9. The elements 112 extend substantially to the lowermost station so that heat is provided to the integrated circuit devices 22 throughout their passage down the track 24 and to that station.

Temperature sensor probes 120 can be provided in both the tracks 24 and the upper rails 32 proximate the lowermost stations in order to ascertain the approximate temperature achieved by the integrated circuit device 22 at the lowermost station. Such probes 120 can be inserted into the tracks 24 and rails 32 obliquely with respect to the plane defined by the upper surfaces of the tracks 24. Outermost ends 122 of the probes 120 can be disposed immediately proximate the lowermost station in order to obtain the most meaningful readings.

Information sensed by the probes 120 can be passed to a micro processor (not shown). When it has been determined by the micro-processor that the approximate temperature achieved by the device 22 at the lowermost station is at a desireable level, the micro-processor can initiate a signal to the solenoid 106 to actuate the shaft 94 carried by the second stop 78 in order to move the tab carried by that stop through the elongated aperture 116 and into a position obstructing movement down the track 24. As previously described, such actuation will, resultantly, effect release of the bottom device 22 in the string by the first stop 62. Once the device, second from the bottom in the string, is at the station, the temperature sensed will probably be lower than desired, and that information will be transmitted to the micro-processor to, in turn, initiate a signal to the solenoid 106 to retract the second stop tab 80 so that the first stop 62 will be permitted to again impinge upon the device in the lowermost station. As this occurs, the device which was allowed to pass into engagement with the tab 80 carried by the second stop 78 will be released to pass to the test site.

Numerous characteristics and advantages of the invention for which this application has been submitted have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. Apparatus for bringing integrated circuit devices, having a body portion and contacts extending therefrom, to a temperature, prior to being tested at a test site, to which the devices will be subjected during operating conditions, comprising:

(a) a plurality of heat tracks down which devices move to the test site with the body portion of the device maintainable at the temperature to which the devices will be subjected during operating conditions;

(b) a plurality of heated rail means spaced from and corresponding to said plurality of heated tracks to sandwich devices passing down said track therebetween with a small gap between said rail means and device body portions to permit movement of the devices down said tracks; and (c) means for simultaneously adjusting the spacing between said plurality of tracks and corresponding rail means.

2. Apparatus in accordance with claim 1 further comprising means mounting said tracks into a unitary assembly, and wherein said simultaneous adjusting means comprises a rotatable thumb wheel carried accessibly by said mounting means and means for translating rotation of said thumb wheel into movement of said rail means toward and away from said tracks.

3. Apparatus in accordance with claim 1 further comprising a housing enclosing said plurality of tracks and rail means to retain heat around integrated circuit devices passing down said tracks, said simultaneous adjusting means comprising a rotatable thumb wheel carried accessibly by said housing and means for translating rotation of said thumb wheel into movement of said rail means toward and away from said tracks.

4. Apparatus in accordance with claim 3 wherein said tracks are of substantially equal lengths and extend generally parallel to one another to define a generally rectangular matrix, and wherein said rail means comprises a unitary rack including a plurality of rails corresponding in number and approximate lengths to said tracks, each of said rails being disposed opposite one of said tracks to sandwich a string of integrated circuit devices therebetween.

5. Apparatus in accordance with claim 4 further including means for supporting said rack above said matrix of tracks to define a plane substantially parallel to a plane defined by said matrix.

6. Apparatus in accordance with claim 5 wherein said supporting means comprises a corner post positioned proximate each of four corners of said rectangular matrix, and wherein said simultaneous adjusting means comprises means for concurrently reciprocating said corner posts along paths substantially perpendicular to said plane defined by said matrix.

7. Apparatus in accordance with claim 4 further including means carried by said housing for providing a digital representation of the spacing between said rack and said generally rectangular matrix.

8. Apparatus in accordance with claim 3 further comprising means for affording access to said housing.

9. Apparatus in accordance with claim 8 wherein said affording means includes a cover comprising a substantial segment of an upper wall of said housing hinged to a side wall of said housing generally along an axis parallel to axes of elongation of said tracks.

10. Apparatus in accordance with claim 9 wherein a lower portion of said cover is hinged along an axis running through said cover generally perpendicularly to axes of elongation of said tracks, wherein access can be obtained to both substantially the entire housing and only said discharge ends of said tracks.

11. Apparatus for consecutively releasing the bottom device of a string of integrated circuit devices passing down a heated, inclined track having a lowermost station and an aperture formed through said track below the lowermost station, comprising:
(a) a first stop disposed on a side of the track along which the devices pass, said stop being biased toward said track to impinge upon the bottom device to hold it in tight engagement with the track at the lowermost station thereof, wherein maximum heat transfer occurs from the track to a device held at said lowermost station;

(b) a second stop, normally disposed on a side of the track opposite that along which the devices pass, reciprocable through the aperture, to obstruct movement of the bottom device, at a distance from the lowermost station greater than the dimension of a device measured along an axis along which the devices pass down the track;
(c) means for actuating said second stop to move through said aperture; and
(d) means, responsive to movement of said second stop through said aperture, for lifting said first stop from a position impinging upon the bottom device.

12. Apparatus in accordance with claim 11 further comprising a housing enclosing the track to retain heat around said track and means for sensing the approximate temperature to which the integrated circuit device in the bottom station thereof has been raised.

13. Apparatus in accordance with claim 12 further comprising means, responsive to the temperature sensed, for initiating said actuation means to move said second stop through said aperture.

14. Apparatus in accordance with claim 13 wherein said initiation means comprises, in combination, a micro-processor and a solenoid actuator.

15. Apparatus in accordance with claim 11 wherein said first stop carries an abutment, and wherein said lifting means comprises a shoulder, engagable with said abutment, carried by said second stop.

16. Apparatus in accordance with claim 15 wherein said shoulder, when said second stop is disposed in its normal position on said side of the track opposite that along which the devices pass, is spaced from said abutment so that at least a portion of said second stop will pass through said aperture before said first stop is lifted from a position impinging upon the bottom device.

17. Apparatus in accordance with claim 11 wherein said aperture is elongated in a direction in which devices pass down the track, and wherein said second stop is repositionable along said aperture toward and away from said first stop, wherein devices having a different dimension measured along an axis along which they pass down the track can be passed to a test site.

18. Apparatus in accordance with claim 17 wherein the track defines a plane, and wherein said first and second stops move along paths generally perpendicular to said plane.

19. Apparatus in accordance with claim 11 wherein the track defines a plane, and wherein said first and second stops move along paths generally perpendicular to said plane.

20. Apparatus for consecutively releasing the bottom device of a string of integrated circuit devices passing down an inclined track having a lowermost station and an aperture formed through said track below the lowermost station, and for heating each consecutive bottom device to a temperature to which the device will be subjected during operating conditions prior to the device being released to pass to a site at which the device is to be tested, comprising:
(a) means for internally heating the track and for heating devices passing down the tracks;
(b) a heated rail spaced from an upper surface of said track to sandwich devices passing down the track therebetween with a small gap between said rail and the devices to permit movement of the devices down the track;
(c) a first stop disposed on an upper side of the track, said stop being biased toward the track to impinge upon the bottom device to hold it in tight engagement with the track at the lowermost station thereof to effect maximum heat transfer from the track to the device;

(d) a second stop, normally disposed on the bottom side of the track, reciprocable through the aperture, to obstruct movement of the bottom device, at a distance from the lowermost station greater than the dimension of a device measured along an axis along which the devices pass down the track;

(e) means for actuating said second stop to move through said aperture; and (f) means, responsive to movement of said second stop through said aperture, for lifting said first stop from a position impinging upon the bottom device.

21. Apparatus in accordance with claim 20 wherein said internal heating means comprises heaters embedded within the track, and further comprising a housing enclosing the track and rail to retain heat around integrated circuit devices passing down the track.

* * * * *